United States Patent [19]
Penn

[11] Patent Number: 5,459,546
[45] Date of Patent: Oct. 17, 1995

[54] METHOD AND APPARATUS FOR ACCURATE ALIGNMENT OF SEMICONDUCTOR WAFERS IN PHOTO PRINTERS

[76] Inventor: Randy J. Penn, 1215 Park Ave., Allentown, Pa. 18103

[21] Appl. No.: 937,478

[22] Filed: Aug. 28, 1992

[51] Int. Cl.⁶ .............................. B23Q 1/00; G03B 27/42
[52] U.S. Cl. .......................... 355/53; 250/492.2; 269/53
[58] Field of Search ..................... 118/728–730; 269/53–545; 250/492.1, 492.2; 414/225; 156/580.2; 355/53

[56] References Cited

U.S. PATENT DOCUMENTS

| | | | |
|---|---|---|---|
| 3,457,132 | 7/1969 | Tuma et al. | 156/580.2 |
| 3,459,610 | 8/1969 | Dijkers et al. | 156/580.2 |
| 4,473,455 | 9/1984 | Dean et al. | 204/298.15 |
| 4,601,560 | 7/1986 | Isohata et al. | |
| 4,609,285 | 9/1986 | Samuels. | |
| 4,624,728 | 11/1986 | Bithell | 269/53 |
| 4,633,051 | 12/1986 | Olson | 219/10.491 |
| 4,724,621 | 2/1988 | Hobson et al. | 34/218 |
| 4,788,577 | 11/1988 | Akiyama et al. | 355/53 |
| 4,804,433 | 2/1989 | Smith | 269/54.1 |
| 4,847,664 | 7/1989 | Wally, Jr. et al. | 355/76 |
| 4,856,456 | 8/1989 | Hillman et al. | 118/500 |
| 4,919,076 | 4/1990 | Lutz et al. | 118/721 |
| 4,966,519 | 10/1990 | Davis et al. | 414/786 |
| 4,978,412 | 12/1990 | Aoki et al. | 118/728 |
| 4,996,942 | 3/1991 | deBoer et al. | 118/666 |
| 5,040,484 | 8/1991 | Mears et al. | 118/503 |
| 5,061,144 | 10/1991 | Akimoto et al. | 414/225 |
| 5,094,885 | 3/1992 | Selbrede | 427/248.1 |
| 5,169,453 | 12/1992 | Takagi | 118/728 |
| 5,197,089 | 3/1993 | Baker | 414/225 |
| 5,213,650 | 5/1993 | Wang | 118/728 |

FOREIGN PATENT DOCUMENTS

| | | |
|---|---|---|
| 1100130 | 1/1968 | United Kingdom. |
| 1250464 | 10/1971 | United Kingdom. |
| 1485851 | 9/1977 | United Kingdom. |

*Primary Examiner*—Chester T. Barry
*Attorney, Agent, or Firm*—Charles Wilkinson

[57] ABSTRACT

Detrimental buildup of tramp photoresist material upon the positioning pads of a stage plate for wafer printing machines is prevented by providing an arcuate point contact surface upon the positioning pads. The wafer is supported a predetermined focal length from the photoresist light curing source by said point contact support. The arcuate surfaces do not tend to collect deposits of adherent tramp photoresist material. The arcuate positioning surfaces are formed from a smooth, hard material. Preferably, the arcuate surface is provided by a hard ball bearing recessed into the surface of the pad and is adjusted during set up by a rod applied to the inside surface of the ball bearing which remains after adjustment of the arcuate surface to the proper position and serves as a reinforcement for the arcuate surface. The surfaces of the positioning pads are preferably mechanically cut back to accommodate the arcuate positioning surface in a retrofit installation.

17 Claims, 3 Drawing Sheets

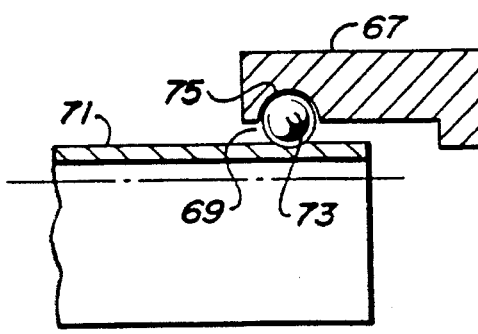
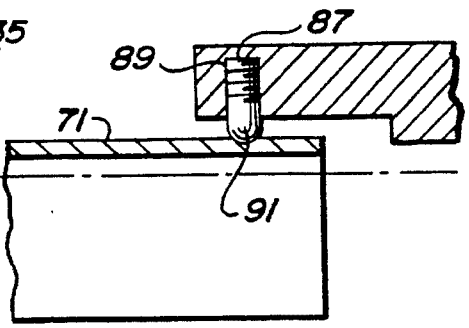
FIG. 12  FIG. 14
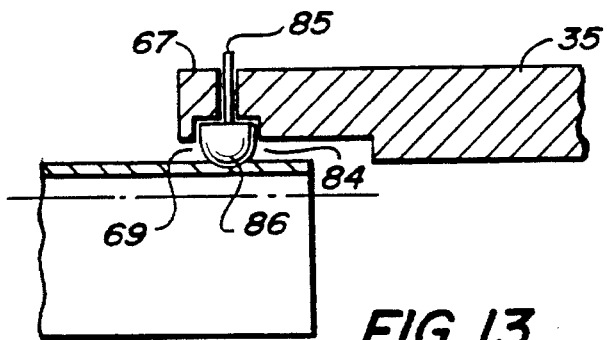
FIG. 13
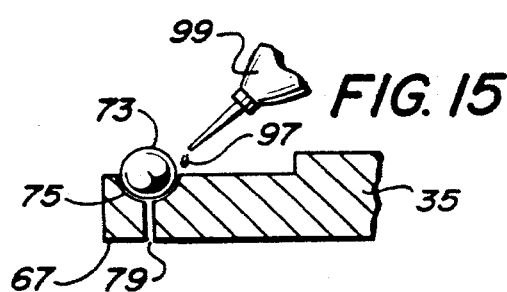
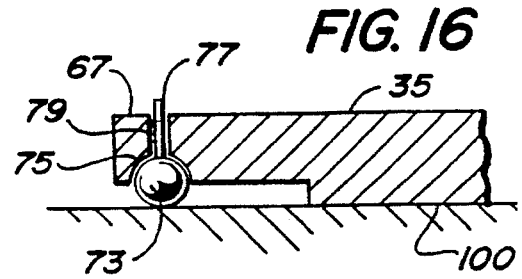
FIG. 15  FIG. 16
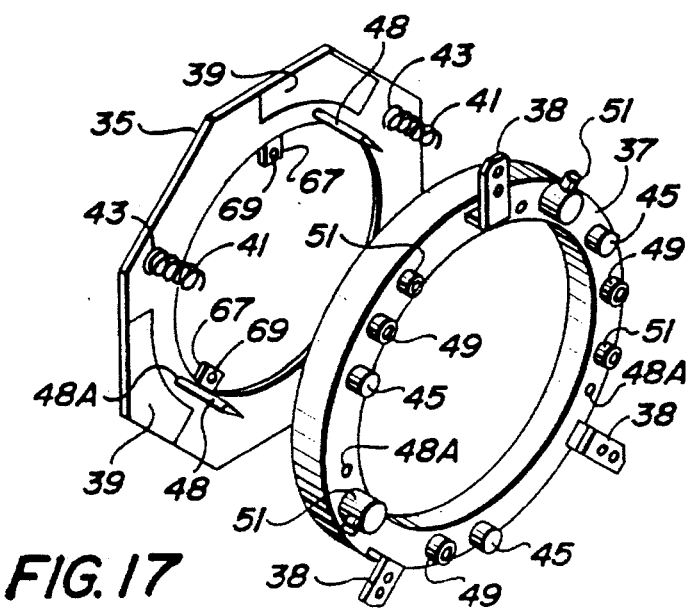
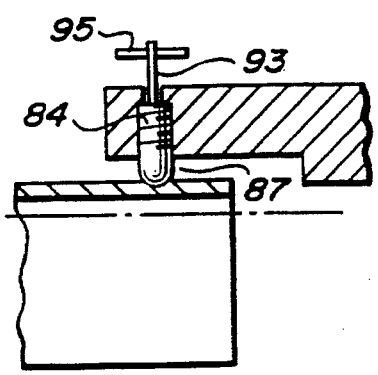
FIG. 17  FIG. 18

METHOD AND APPARATUS FOR ACCURATE ALIGNMENT OF SEMICONDUCTOR WAFERS IN PHOTO PRINTERS

BACKGROUND OF THE INVENTION

1. Field of the Invention

This invention relates generally to semiconductor manufacture, more particularly to alignment of semiconductor wafer-printing machines and more particularly still, to wafer-holding techniques, including an apparatus and method for holding semiconductor wafers at a uniform focus point for printing of a mask pattern upon the surface of semiconductor wafers.

2. Discussion of the Prior Art

Semiconductors are formed from semiconductive materials such as silicon and the like. Usually an artificial crystal of silicon such a P-type silicon to which a particular dopant substance such as boron has been added before crystallization from a hot melt, is sliced into a hundred or more slices or so-called wafers which can then be formed into individual semiconductor chips by a photographic curing process. Each slice or wafer of semiconductor material may be from about three to five inches in diameter, depending on the particular process and apparatus, and about twenty-five mils, or twenty-five thousandths, of an inch, thick. The slices, or wafers, are first ground flat and polished to a mirror finish. Such slices, or wafers, are then heated in an oven containing oxygen and steam, causing a very thin layer of silicon oxide to form over the whole surface of the wafer where subsequent circuitry is to be formed. The silicon oxide film may be about 0.04 to 0.8 mils thick. A thin film of light-sensitive liquid plastic material referred to as "photoresist material" or "photoresist" is then applied to the surface of each wafer and this liquid is dried to form a solid photoresist film over the surface.

The coated wafer is then exposed to ultraviolet light, except in numerous, usually thousands, of tiny spots and strips where so-called N-regions are to be formed in the final semiconductor chips. To form the tiny spots and strips where ultraviolet light is not impinged upon the surface, the light is passed through a glass microfilm plate called a "photomask" that covers or shadows the wafer. Such photomask incorporates a photographically reduced pattern of very accurately spaced opaque or dark areas which shade the desired parts of the wafer or more particularly, the photoresist layer on the surface of the wafer from the light. As a result of such shading, the ultraviolet light only strikes a portion of the surface of the wafer where it cures the photoresist material, making such photoresist very strong and resistant to removal. The soft, unhardened areas of photoresist which have not been cured by the light because shadowed by the photomask are next washed away from the surface of the wafer with a solvent, leaving the hardened areas attached to the surface. Thereafter the wafer is dipped in an acid bath or otherwise treated with acid which etches or dissolves the oxide film in those portions of the surface where it is unprotected by the hardened or cured photoresist plastic layer. A type of acid is selected that does not affect the photoresist material or the silicon material, but only removes the silicon oxide film, resulting in an orifice or opening through the oxide layer which may be of the order of one mil in diameter.

The remaining hardened or cured photoresist material is next removed by a stronger solvent than was applied before, and the slice of wafer is placed in a very hot oven held at about 1,200° C., where the slice is exposed to a gas containing a further dopant substance such as, in many cases, phosphorus, which is used to form N-type silicon. The phosphorus material in the gas diffuses into the silicon in the area of each hole through the oxide film, changing the underlying silicon from a P-type to an N-type silicon. The remaining oxide layer continues, however, to block diffusion to all other areas. Normally, the phosphorus may be diffused to a depth of about 0.08 mils or the like, after which the wafer is removed from the diffusion oven. The N-type regions are then recoated with an oxide layer by a second oxidizing treatment which forms a silicon oxide insulation area. In more complicated semiconductors, there may be several stages of diffusion forming various layers formed of various doped material.

As a final step in the production of the electrical circuit portion of the wafer assembly, a further set of holes is made through the oxide layer where electrical connections are desired and the slice or wafer is coated with a thin film of aluminum over the silicon oxide layer with the aluminum directly contacting the silicon through the holes in the silicon oxide. A new layer of photoresist material is then applied to the entire surface and the wafer is again exposed to ultraviolet light through a mask to map out a desired pattern of electrical conductive areas which will serve as circuit "wires" for connection of the various doped portions of the underlying silicon. After the photoresist material is then cured by exposure to ultraviolet light projected through the mask, the uncured portions are removed by a suitable solvent, after which the underlying aluminum may be etched away by an acid etch, leaving the aluminum electrical conductor portions protected by the cured photoresist material. Such cured photoresist may then be removed by a second solvent, or in some cases, may be left on the surface as an insulating material. As a final step, a number of individual semiconductor chips are carefully sawed by means of diamond blades out of the wafer severing repeating patterns of individual semiconductor chips formed in the material of the wafer.

As may be recognized, the exposure of a semiconductor wafer to ultraviolet light to cure the photoresist material, referred to generally as printing the wafer, constitutes a critical procedure in the production of individual semiconductor chips from a wafer. Since the circuit portions formed on the surface of the wafer, both in doping the surface of the wafer and forming electrical contacts on the surface of the wafer, are very small, it is important that the various areas be both placed and dimensioned extremely accurately so that effective and accurate circuits may be formed. This is accomplished by using a very accurately dimensioned mask with very sharp divisions between the transparent and the opaque portions of the mask and by having the ultraviolet light focused very accurately as it both passes through the mask and reaches the surface of the wafer. In order to obtain such accurate focusing, it is necessary to have the photomask accurately positioned with respect to the light source and to have the surface of the wafer accurately positioned with respect both to the light source and the mask.

It is fairly easy to accurately position the photomask from the light source accurately, but considerable difficulty has been encountered in the past in accurately positioning the wafer surface from the light source and mask.

In most installations, the wafer has been supported by a so-called stage plate, or xy base plane or focal plane plate, which holds the wafer. In one type of printing apparatus, such stage plate has been very accurately mounted at a predetermined distance from the light source. The stage plate is provided with wafer surface contact pads, or focal reference pads, against which the wafer is pressed during operation by a chuck which usually picks up the wafer by means of vacuum applied to the face of the chuck from a wafer transfer arm, after which the chuck moves into close proximity to the stage plate such that the surface of the wafer is positioned against the positioning pads, or focal reference pads, of the stage plate. After positioning of the wafer, the ultraviolet light source is activated or a shutter opened and the light is impinged on the surface of the wafer which, due to the original accurate positioning of the stage plate and the light source, is very accurately positioned on the wafer surface. Means are provided for checking the positioning periodically through a special tooling mask called a "focus wedge mask" which can check the distances very accurately, and means are provided for recalibration of the entire device. However, if a satisfactory production rate is to be attained or maintained, the alignment of the apparatus cannot be recalibrated between each application of a wafer to the stage plate, and anything which would tend to cause miscalibration can interfere with the accuracy of the circuits ultimately produced in the semiconductor chips.

A later type of automatic printer provides for automatic adjustment of either the light source or the stage plate, or both, after each wafer is positioned upon the stage plate so that the apparatus is continuously recalibrated. Such apparatus is considerably more expensive than the earlier or alternative apparatus having a fixed focus or focal length between the light source and the stage plate. In addition, the refocusing operation between the positioning of the wafer on the stage plate and the activation of the ultraviolet light takes a finite amount of time and therefore tends to slow down production of finished wafers.

One of the principal difficulties or drawbacks of fixed-focus machines has been that portions of the photoresist layer have tended to rub off the wafers so that over a period, a significant deposit of photoresist may build up upon the pads of the stage plate. Such deposit of photoresist material tends to hold or space subsequent wafers at increasing distances from the positioning pads so that the surface of the wafer from one wafer to the next tends to be displaced progressively farther from the light source. This effect has been counteracted in fixed-focus machines in the past largely by manually wiping the surfaces of the pads between every twenty-five to fifty, or even fewer, wafers to keep such pads clean and remove any buildup of material. Such manual wiping inherently takes a significant time and also requires opening up a normally closed apparatus exposing the wafer material to possible contamination and the like. Furthermore, the wiping procedure is not always successful and may result in a differential amount of photoresist material remaining on the various pads causing the wafer not only to be displaced away from the light source, but to be cocked slightly to one side, causing accentuated difficulties in forming accurate images upon the surface of the semiconductor material. Even with the development of an automatic wiping device which may operate during the period when the chuck is moving a new wafer into position, additional complications and variations are added.

Of course, the difficulty with photoresist buildup upon the focal reference pads, or positioning pads, may be substantially counteracted, but not alleviated, by the more costly and complicated automatic focus machines, but such machines have their own drawbacks, including not only greater initial cost, but more complexity with the result there are more things to go wrong with resultant additional downtime for repairs and greater operating cost as well as first cost.

There has been a need, therefore, for some method or means to prevent buildup of deposits of photoresist material upon the positioning pads of a stage plate in a fixed-focus wafer photo-printing apparatus.

Objects of the Invention

It is an object of the present invention, therefore, to provide an effective and efficient means to prevent buildup of photoresist deposits upon the positioning, or focal reference, pads of a stage plate in a photo wafer printing machine.

It is a further object of the invention to prevent buildup of photoresist material upon the positioning pads of a stage plate by providing an arcuate upwardly extending surface from the focal reference pad of a stage plate upon which photoresist material does not tend to collect.

It is a still further object of the invention to provide a hard deposit resistant extension from the surface of a positioning, or focal reference, pad upon a stage plate, which deposit-resistant extension provides an accurately positioned surface for support of the surface of the wafer.

It is a still further object of the invention to provide an arcuate positioning surface for support of a wafer during a photoprinting manufacturing process at an accurate distance from the ultraviolet light surface.

It is a still further object of the invention to provide a wafer support surface upon a positioning, or focal reference, pad of a stage plate in which an arcuate contact surface is formed upon a separate physical structure which is countersunk within the surface of the positioning pad at an accurate position and height.

It is a still further object of the invention to provide a photoresist deposit resistant surface upon a positioning pad of a stage plate for a photo-printing apparatus in which a hard spherical object is partially countersunk within the surface of the pad and is positioned accurately by means of a rod extended through an orifice in the pad and making contact with such spherical object.

It is a still further object of the invention to provide a method of arranging a positioning sphere upon a positioning pad of a stage plate by providing adhesive material within an orifice within the pad, providing a thin rod means within an extension from said orifice to an outer surface of the pad, positioning a spherical support means within the orifice and placing the stage plate face down upon a perfectly flat surface and pressing the rod means against the rear of the spherical support means to bring them securely against the flat surface and allowing the adhesive material to harden to secure the spherical support means and rod means together.

It is a still further object of the invention to provide an accurately positioned arcuate positioning protrusion upon a focal reference pad of a stage plate by positioning a rod having an arcuate end in an orifice within the pad.

It is a still further object of the invention to provide a method of accurately positioning the surface of a wafer from a photoresist curing light source from one wafer curing operation to another by accurately positioning the stage plate at a controlled distance from the light source and positioning the wafer surfaces against arcuate supporting surfaces accurately positioned upon the surface of focal reference pads extending from the stage plate to support the wafers in position.

It is a still further object of the invention to accurately position the surface of semiconductive wafers from a photoresist curing light source by placing the wafer surfaces against arcuate positioning surfaces on a stage plate to prevent accumulation of photoresist material upon the surfaces of the positioning means.

Other objects and advantages of the invention will become evident from review of the following description and appended figures.

BRIEF DESCRIPTION OF THE INVENTION

It has been found that the buildup of thin deposits of photoresist material upon the positioning pads, or focal reference pads, of stage plates in photo-printing apparatus for semiconductor wafers can be prevented by providing arcuate point contact surfaces extending from the surfaces of such positioning pads, such arcuate contact surfaces being preferably formed from a hard wear-resistant material, more preferably in the form of a ball bearing recessed in the surface of such pad with a very accurately positioned surface. It has been found that the arcuate surfaces do not tend to build up a deposit of photoresist material from one wafer to another, so that the accurate positioning of the surfaces of the wafers from the light source is maintained. A preferred construction of the arcuate surface as well as a preferred method of positioning such arcuate surface accurately with respect to the light source involves the use of a back-up rod accommodated in a passageway in the focal reference pad both to reinforce the position of the positioning means and to serve as a means to accurately position the arcuate point contact surfaces with respect to the surface of the focal reference pads. The secondary back-up rod and primary arcuate point contact surfaces are preferably held in place after careful alignment by a suitable adhesive material.

BRIEF DESCRIPTION OF THE DRAWINGS

FIG. 12 is a sectional view through a still further embodiment of the invention.

FIG. 13 is a sectional view through a still further embodiment of the invention.

FIG. 14 is a sectional view through a still further embodiment of the invention.

FIG. 15 is a sectional view through a positioning pad upon a stage plate which has been reversed in order to allow the application of an adhesive to the orifice in which the arcuate positioning means of the invention is installed.

FIG. 16 is a sectional view through the positioning pad of the stage plate shown in FIG. 15 with the stage plate and pad reversed and positioned upon a flat surface pursuant to attainment of the required critical positioning of the parts.

FIG. 17 is an isometric view of a stage plate in accordance with the invention together with the focus ring assembly designed to mount the stage plate to the wafer arm.

FIG. 18 is a sectional view through a still further embodiment of the invention showing a further adjustment means for the positioning means.

DESCRIPTION OF THE PREFERRED EMBODIMENTS

Figure 1:
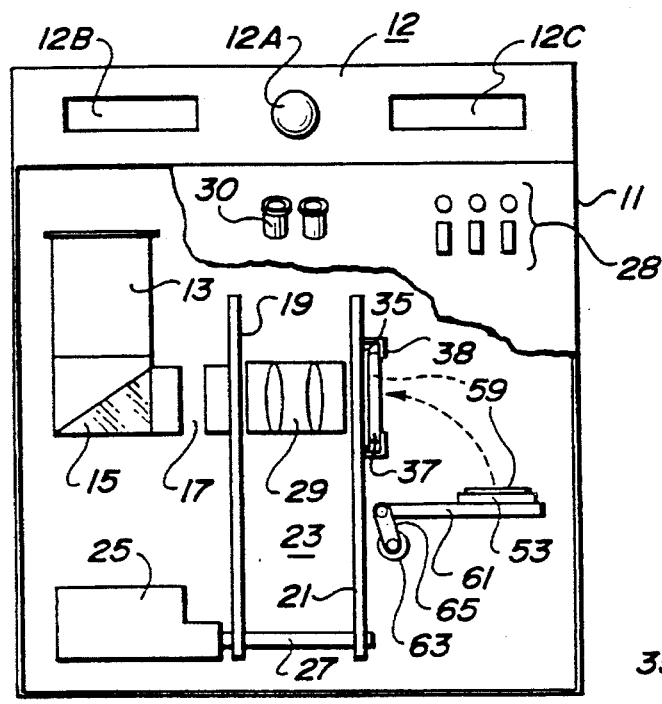
FIG. 1 is a diagrammatic elevation view of a partially broken-away housing for a printer for the production of semiconductor wafers showing some of the more important internal operating components.

A long continuing difficulty has been had with certain types of semiconductor printing apparatus in which the stage plate and light source are positioned at a preset accurately determined distance apart and are thereafter, operated at such distances with minimal readjustment by placing the wafers to be printed against the positioning pads, or focal reference pads, of the stage plate which determines accurately the positioning of the face of the wafer from the light source as well as from the photo mask material. While such apparatus is efficient, effective and relatively inexpensive compared to continuous recalibration-type apparatus, it has been subject to persistent difficulty with buildup of stray or tramp photoresist material upon the positioning pads of the stage plate. Such progressive buildup of stray or tramp photoresist material upon the positioning pads over a period, such as the period or time involved in the treatment of from five to ten wafers, results in the wafer being held away from the surface of the stage plate or the positioning pads upon such stage plate sufficiently so that a significant misalignment of the light upon the surface of the wafer results. Misalignment after twenty-five or more wafers have been treated may become intolerable and require intervention to remove the buildup or to realign the position of the wafers. Such misalignment of the light will result in a fuzzy image of the mask upon the surface of the wafer with resultant poor quality final semiconductor material produced.

For some years, the standard prevention of misalignment due to photoresist buildup has been to manually or otherwise wipe the position pads on the stage plate between every so many applications of the wafers to the stage plate or seatings of wafers upon the stage plate to remove the errant photoresist material. While such wiping, if religiously done, does effectively prevent buildup of photoresist material on the pads, such wiping takes time, slowing down production and requires the housing of the photoprinting apparatus to be opened to gain access to the stage plate. There is consequently more chance of dust particles, lint and the like entering into the apparatus and contaminating the surface of the wafers. In addition, such wiping may not always remove the same amount of photoresist material from the several positioning pads, leading not only to the wafer being misaligned an absolute distance from the light source, but also being differentially misaligned from positioning pad to positioning pad, in effect, causing a cocking of the wafer so that one side of the wafer is more misaligned than the other with resulting further difficulties.

The present inventor has found that the buildup of errant photoresist material upon the positioning pads of a stage plate may be effectively counteracted by providing upon the surface of the positioning pad an arcuate positioning means, the top portion of the arc of which actually contacts the surface of the thin layer of photoresist material upon the wafer. The arcuate surface, which may preferably be a portion of a round circumferential body recessed in the surfaces of the positioning pad, is resistant to the adhesion of the photoresist material to such surface, and effectively prevents buildup of photoresist layers upon such surface with the result that great numbers of consecutive wafers can be positioned against such arcuate positioning means without buildup of deleterious layers of photoresist material which might alter the positioning of the surface of a wafer upon the stage plate.

Figure 2:
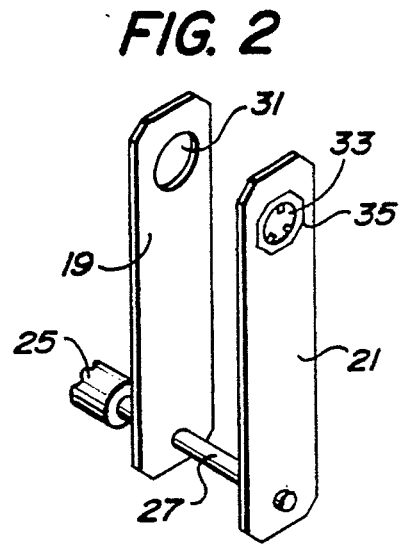
FIG. 2 is a schematic view showing a wafer arm and mask arm with a stage plate mounted upon the wafer arm in the position shown in FIG. 1.

FIG. 1 is a diagrammatic partially broken-away elevation of a photo-printing apparatus for the printing of the outlines of areas of various electrical characteristics upon the surface of a semiconductor wafer. In FIG. 1, 11 designates the housing or casing of the apparatus which includes a light source 13 in which high intensity ultraviolet light is generated and passed down through a series of optical elements 15 and out of the apparatus at right angles to the light source towards and through a photomask 17 which is supported upon a mask arm 19. Such mask arm together with a wafer support arm 21, forms a unitary boxed-in structure which may be referred to generally as the pivoting arm 23 which may be pivoted by an operating motor 25 via a suitable shaft 27 connecting the two arms 19 and 21. The arms may be connected to each other by webs extending between various portions, and particularly at the top, forming a unitary structure. Such connecting means are not shown in the diagrammatic view of FIG. 1. The pivoting motor 25 may also frequently be positioned at right angles to that shown in FIG. 1 and move the pivot arm unit 23 by a helical thread arrangement upon a separate pivot shaft. Between the mask arm and the wafer arm, 19 and 21 respectively, forming the pivoting arm 23, there is supported an optical system designated generally as 29. Such optical system serves to enhance the image cast by the mask 17 in the ultraviolet light beam projected through the mask ring 31 which, as shown in FIG. 2, constitutes an opening in the mask arm and the wafer ring 33, which also constitutes an opening in the wafer arm 21. A stage plate 35 is secured to the wafer arm 21 by a so-called focus ring 37, which in unsophisticated systems, may merely define the area in which the stage plate, or xyθ base or focal plane plate, may be positioned and may hold the stage plate in position upon the mask arm. However, as well known to those versed in the art, more sophisticated systems will incorporate means for allowing the stage plate to be conveniently moved under the focus ring or between the focus ring and the wafer arm in order to accurately align a wafer held by the stage plate in position so that the shadow of the mask is accurately positioned upon the surface of the wafer.

Usually the focus ring is directly connected to the mask arm by so-called flexure mounts 38, which definitively position the focus ring 37 upon the wafer arm 21 relative to the wafer ring 33. The stage plate, or xyθ focal plane plate, is then movably supported or connected to the focus ring by connecting springs 41 which are mounted in connection orifices 43 in the stage plate and deadhead secured in recessed spring mountings 45 in the focus ring. See, in particular, FIG. 17. The recessed spring mountings 45 provide an opening and/or housing in the focus ring 37 in which the springs 41 may be held when the stage plate 35 is pulled closely against the focus ring 37.

The springs 41 hold the stage plate resiliently against the focus ring, and particularly against two flexure-type brake pads 39 normally mounted upon the surface of the stage plate. When it is desired to move or adjust the position of the stage plate with respect to the focus ring, air is injected through air-bearing fittings 49 which project air against the surface of the stage plate, forcing the stage plate slightly away from the focus ring against the tension of the springs 41. The stage plate is then essentially held by an air bearing against the tension of the springs. This allows the stage plate to be easily moved by a very light impetus from the side by any suitable mechanical device, very often of a vernier screw type, which allows the stage plate to be evenly and incrementally moved while the operator peers into the micro-optics of the apparatus until the plate is exactly aligned.

When exact alignment of the plate is attained, vacuum may be directed by any suitable means into brake pad vacuum fittings 51, the ends of which project near the brake pad flexure mounts 39. Such vacuum system acts to pull the brake pad flexure mounts towards the focus ring and thus to bring the stage plate into substantial contact with the focus ring. In other words, the vacuum brake fittings 51 act or move the stage plate in the same direction as the connecting springs 41, while the air bearing fittings 49 act in the opposite direction, releasing the stage plate for accurate incremental movement by very light impetus or force applied by any suitable movement or adjustment device, not shown. A rough transverse alignment of the stage plate 35 and focus ring 37 is attained initially by the alignment pins 48 which extend from the stage plate 35 through prepositioned orifices 48A in the focus ring. Such alignment pins are shown in FIG. 17 ready to be entered into the orifices 48A in the focus ring 37.

After the stage plate 35 is correctly positioned, a vacuum chuck 53, which has had a silicon or other semiconductor wafer transferred to its upper surface 55 by a transfer arm, not shown, from some supply of individual wafers, also not shown, pivots upwardly to deposit the wafer against the positioning pads of the stage plate. The vacuum chuck 53 has upon its surface 55, a series of crisscrossing grooves 57 in which a vacuum may be established to hold the back of the wafer. After the wafer 59 is grasped through the vacuum chuck 53, the chuck 53 may be pivoted upwardly through the pivot arm or chuck arm 61, operated by a motor 63 through a belt or any other suitable drive 65, until the wafer 59 is brought into position within the focus ring 37 with the front surface of the wafer 59 seated upon the positioning pads 67 of the focus ring. The series of elongated channels 50 in the surface of the stage plate 35 in FIG. 7 supply vacuum to hold the chuck 53 to the stage plate 35 during normal operation.

Figure 4:
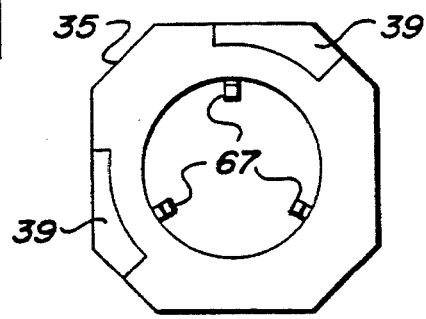
FIG. 4 is a plan view of a stage plate in accordance with the prior art showing the wafer positioning, or focal reference, pads without the installation of the positioning means of the invention and, therefore, designated as prior art.
Figure 3A:
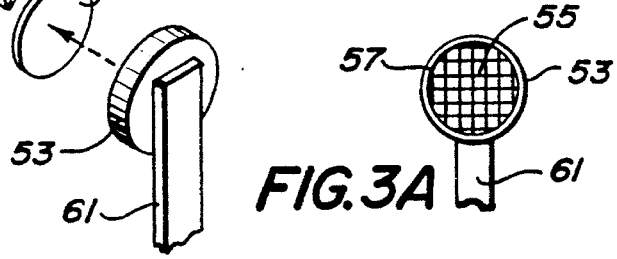
FIG 3A shows the face of the vacuum chuck shown at the right of FIG. 3.
Figure 5:
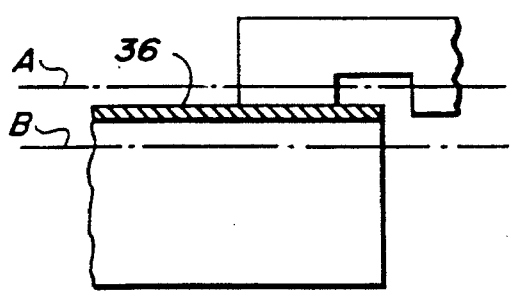
FIG. 5 is a side or sectional view of one of the positioning pads shown in FIG. 4 in accordance with the prior art in initial contact with an early wafer in a sequence of wafers being photo treated by the apparatus shown in FIG. 1.
Figure 6:
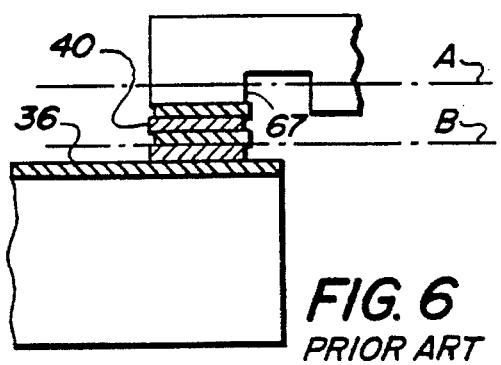
FIG. 6 is a side or sectional view, again in accordance with the prior art, showing the positioning pad of the stage plate as shown in FIG. 4 after such pad has positioned a series of wafers from a light source and showing a series of deposits of photoresist material which have partially adhered to the surface of the pad and as shown in FIG. 6, hold the pad away from the surface of the wafer preventing its accurate positioning with respect to the photoresist curing light source.

As shown in FIGS. 4 through 6, which illustrate prior art stage plate arrangements, the positioning pads, or focal base pads 67, of the prior art allow the wafer 59 to seat directly against the surface of the positioning pads so that when the vacuum chuck seats the wafer through the focus ring onto the positioning pads there is considerable force upon such pads as the photoresist layer 36 contacts the face of the pad 67. As explained above, it has been found that layers 40 of photoresist material build up on the pads 67, as shown particularly in FIG. 6. This progressively alters the spacing between the wafer 59 itself and particularly its face and throws the focal length between the photomask and the face of the wafer progressively more out of alignment ruining the image of the photomask upon the wafer surface and causing poor definition of the photomask image. Horizontal lines A and B in FIGS. 5 and 6 show the range of satisfactory focusing possible with the particular focal length involved and it can be seen in FIG. 6 how the surface of the wafer has been pushed below the lower limit of effective focusing.

Figure 3:
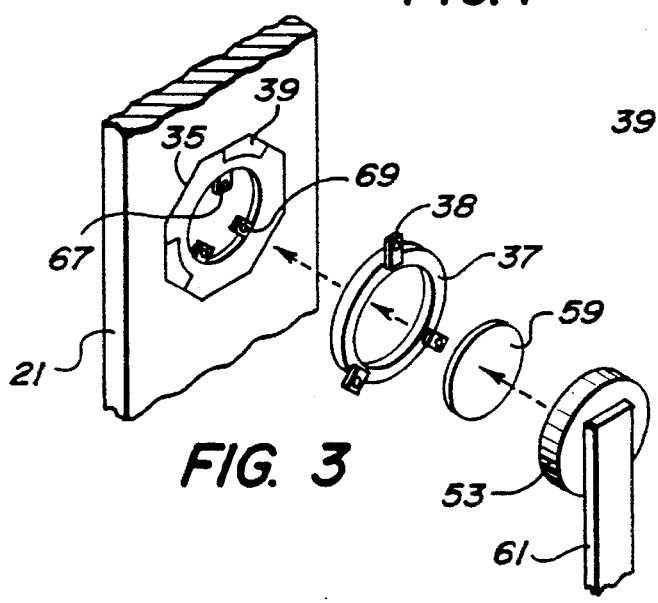
FIG. 3 is an enlarged diagrammatic elevation of the stage plate side of the wafer arm shown in FIG. 2 showing the stage plate, focus ring, wafer and pneumatic chuck separated from each other, but arranged in normal sequential order.
Figures 8, 9:
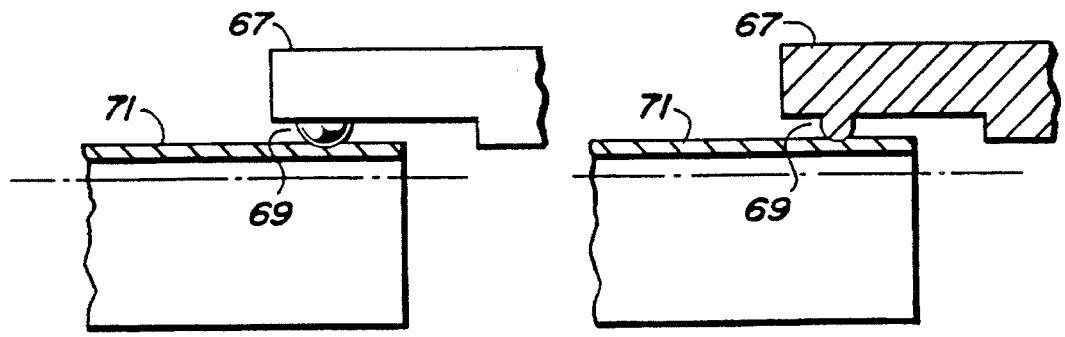
FIG. 8 is a side view partially in section of one of the positioning pads of the stage plate shown in FIG. 7 showing the arcuate point contact positioning means of the invention contacting the surface of a wafer.
FIG. 9 is a sectional view of an alternative arrangement in accordance with the invention showing a different form of arcuate positioning means.
Figures 10, 11:
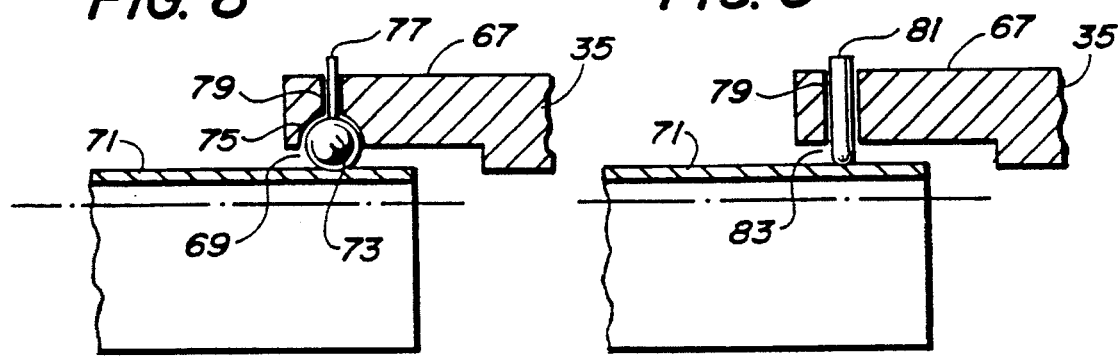
FIG. 10 is a sectional view of a preferred form of positioning means in accordance with the invention seated in a positioning, or focal reference, pad of a stage plate.
FIG. 11 is a further sectional view through a positioning pad of a stage plate and a portion of a wafer showing an alternative arrangement of positioning means in accordance with the invention.
Figure 7:
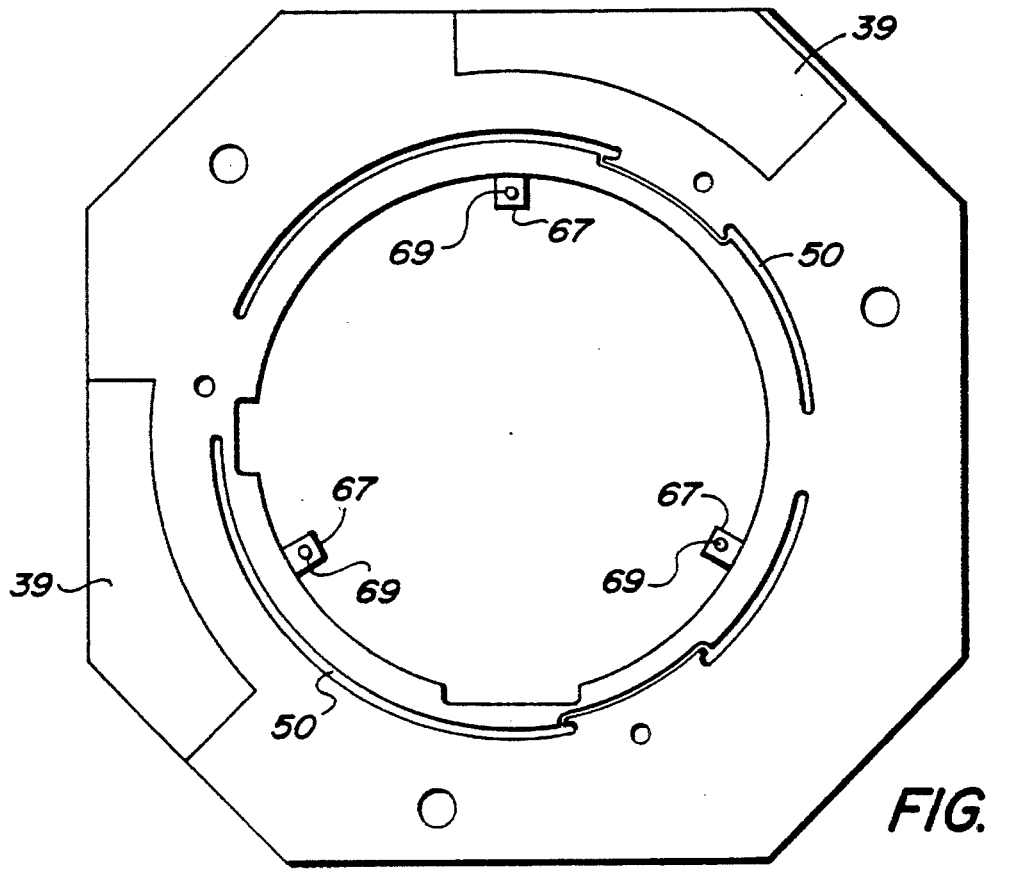
FIG. 7 is a plan view of a stage plate having the positioning means of the invention incorporated into the positioning, or focal reference, pads of such stage plate.

As shown in FIGS. 3 and 7, and particularly FIG. 8 and FIG. 10, in the arrangement of the present invention, the positioning pads 67 are each provided with one of the arcuate positioning means 69 of the invention. Such arcuate positioning means 69 should have a fairly small arc which provides it with essentially a point contact with the surface of the wafer, although, as shown in the various views, the arcuate surface may sink partially into the surface of the photoresist material upon the surface of the wafer 59. The photoresist layer is only a fraction of a mil in thickness so that the spreading out from a point contact of the positioning means of the invention is very minor, even considering the photoresist layer 71. The arcuate positioning means 69 preferably has a small diameter such as, for example, less than ⅛th of an inch. However, it has been found that it should not have too small a diameter such as, for example, a point contact provided by a sharp point such as a conical point, else it will dig into the photoresist layer different degrees, depending upon the hardness of such layer and will in itself, affect the positioning of the wafer surface from the plane of the stage plate. It is found that with the arrangement shown no buildup of layers of errant photoresist material occurs on the positioning pads.

FIG. 9 shows an alternative embodiment of the invention in which the circumference of the arcuate positioning surface is substantially smaller than that shown in FIG. 8, and in which, as a further difference, the arcuate surface is positioned on the end of a substantially cylindrical construction. This arrangement may be formed either by an accurate machining of the surface of the positioning pad into the positioning means of the invention or may, as shown in FIGS. 11 or 14, constitute the rounded end of a separate cylindrical construction. It will be understood that while it is not strictly necessary that the bottom or end of the arcuate surface of the arcuate positioning means 69 be at the same height as the base of the stage plate, it is convenient for this to be arranged so that the base of the stage plate can be used as a reference for the positioning of the maximum extent of the arcuate positioning surface.

In order to arrange the height of the arcuate positioning means 69 to reach the same exact level as the base of the main portion of the stage plate, it is necessary in a retrofit of an existing stage plate to cut or grind off a portion of the positioning pad surface as shown in any of the views 8 through 18 where it will be seen that, compared to the prior art shown in FIGS. 5 and 6, the actual surface of the positioning pad is positioned at a different and lesser or greater elevation than the base of the stage plate itself. The pads, in other words, have a cut back surface which provides room for the arcuate point contact positioning means.

FIG. 10 shows a preferred embodiment of the arcuate positioning means of the invention in which such arcuate positioning means 69 comprises a spherical ball bearing 73 made from a hard material such as chrome steel or the like, which is recessed into an opening in the positioning pad 67. The ball bearing 73 has a certain amount of clearance in the orifice 75 in the positioning pad 67 of the stage plate and its alignment in such orifice 75 is determined by the position of a pin or rod 77 which extends upwardly through an orifice 79 and in the finished stage plate, is held in position by a suitable adhesive, including a suitable epoxy glue, soldering, welding or the like, but preferably including one of the so-called super-glues or special epoxy-type glues which will provide a very secure grip upon metal parts.

In FIG. 11, there is shown a somewhat analogous arrangement to that shown in FIG. 10, but in which instead of there being a separate circular positioning means which, as explained, is preferably a hard ball bearing or the like, there is instead a rod 81 which has a rounded or as indicated, preferably, an arcuate lower surface 83. The rod 81 is, as shown in FIG. 10, fixed within the positioning pad 67 by means of a suitable adhesive or similar material within the rod orifice 79.

FIG. 12 shows a further arrangement of the invention in which a spherical positioning means is provided in the positioning pad 67. The spherical positioning means may also be a ball bearing-type construction and is merely secured in an orifice by an adhesive where it is positioned so as to be an equal height with the base of the stage plate 35. The arrangement, therefore, is substantially similar to that shown in FIG. 10 except for the positioning rod 77 which is not included in FIG. 12. As will be explained subsequently, the arrangement of FIG. 10 provides a much more accurate and efficient way to determine the exact positioning of the arcuate positioning means, however.

FIG. 13 shows an arrangement in accordance with the invention in which the arcuate positioning means 69 comprises a cylindrical structure 84 having an arcuate lower head 86 and including a rodlike section 85 extending upwardly from the cylindrical positioning means and extending slightly from the top of the positioning pad 67. As will become evident below, the arrangement shown in FIG. 13 may be adjusted in a substantially similar manner to that shown in FIG. 10 and is a convenient way to attain exact alignment of all the positioning means.

FIG. 14 shows a still further arrangement of the invention in which a rod-type member 87 has a threaded upper portion which may be threadedly adjusted into a female threaded orifice 89. The threaded rod 87 has an arcuate lower head 91 which constitutes the actual positioning means. As will be understood, the adjustment of the arcuate positioning head 91 is in the embodiment shown in FIG. 14 made by adjusting the threaded rod portion 87 of the assembly. If desired, such arrangement can include an upward extension on the rod portion 84 as shown in FIG. 18, such further extension being indicated as 93, which may have a cross pin 95 in the top for manual adjustment by screwing the threaded portions together to attain accurate adjustment to any level desired, but as indicated above, preferably to the same level as the base of the stage plate to provide a convenient reference plane. The adjustment of this arrangement, as shown in FIG. 18, will, as described below, be to some extent similar to that for the embodiment shown in FIGS. 10 or 11, the method of which is shown in FIGS. 15 and 16 described below. Since the rod 93 and cross pin 95 will normally be very small, a small jeweler's-type tool comprising a cylinder with a groove in the end will frequently be used.

In FIGS. 15 and 16, there is shown in sequence, with respect to a structural arrangement similar to that shown in FIG. 10, the injection of an adhesive into the orifice 75 in which the ball bearing shown in FIG. 10 is seated to provide an adhesive to secure such ball bearing securely in its seat. The adhesive 97, which may be seen emerging from the tip of a tube 99 of such adhesive will also run down into the rod orifice 79. After the adhesive is distributed throughout the ball bearing recess or orifice 75, and the rod orifice 79, the stage plate 35 will be turned over or reversed and placed upon a completely flat surface 100. The rod 77 will then be inserted within the rod orifice 79 and pressed against the ball bearing 73 until such ball bearing is forced downwardly in contact with the flat surface 100. At this point, since the surface 100 is completely flat, the several ball bearings 73 are exactly aligned with the bottom surface of the stage plate 35. With this alignment, if the bottom of the stage plate is placed at a fixed distance from the light source in the printing apparatus, the light source will be exactly the required distance from the front surface of a wafer which is inserted into the focus ring until it contacts the top surface of each of the bearings 73. Furthermore, since the hard arcuate surface of the bearings 73 do not tend to pick up deposits of photoresist material, every succeeding wafer surface which is placed against the bearing 73 will be exactly aligned also with the light source. Even if over a long time period some small amount of photoresist material should be picked up on the surface of the arcuate positioner 69, the buildup is so slow and so slight in amount, that a cleaning or wiping of the positioning surfaces after say hundreds or thousands of wafers have been treated, will remove the problem. Consequently, it will be found that the surfaces either can be used indefinitely without a buildup of photoresist material, or the surfaces will go through several hundred or more cycles of treating the surfaces of wafers before any cleaning of the surfaces is necessary. This is an improvement of a magnitude of 100 or more, and in many cases, a thousand or more and it appears that in at least some installations no wiping will ever be necessary.

It will become evident from the above discussion that not only can the preferred embodiment shown in FIG. 10 be adjusted in accordance with the method set forth, but that a similar adjustment and prealignment of the embodiment shown in FIG. 11 can also be made in substantially the same manner. Furthermore, with respect to the embodiment shown in FIG. 18, again a substantially similar method can be used in which the cylindrical positioning means having a round or arcuate bottom portion is adjusted by revolution of the threaded positioning means through the agency of the extension 93 which may be gripped by means of the cross pieces 95 and the section threaded downwardly until it just barely contacts a flat alignment surface.

The procedure for alignment of the various positioning means described above in connection with FIGS. 15 and 16 may be varied in several ways. For example, if the rods or pins 77 are all of exactly the same length the stage plate 35 may be placed upon a flat surface 100 as shown which may be the surface of a glass plate and a second uniformly flat surface such as another glass plate may be placed on top of the rods or pins 77 to press them uniformly against the ball bearings 73 to precisely adjust these bearings. Using the same procedure the stage plate may be retained in an inverted position and the rods or pins contacted by the lower surface or glass plate and the ball bearings aligned upon the upper flat surface or glass plate. This may be advantageous in preventing escape of the adhesive until it is set.

It is preferable in the embodiment shown in FIG. 18, that the final adjustment be made permanent by placing adhesive between the threads of the device so that it may not move during use. The embodiments shown in FIG. 18 and likewise in FIG. 14 have the advantage of being somewhat stronger, since the interengaged threads strengthen the entire assembly, which is then merely locked in place by an adhesive. However, the arrangement in FIG. 14 may be somewhat difficult to arrange in an absolute level condition, while the arrangement shown in FIG. 18 is subject to requiring a delicate feel so as to determine whether there is actual contact with the underlying flat surface. Normally, therefore, the arrangement shown in FIG. 10 will be preferred, since when aligning the positioning means in the positioning pads, each alignment means is equally acted upon by gravity and only a light pressure is necessary to force such positioning means downwardly or, alternatively, upwardly, by the rod 77 so that a uniform leveling of all the positioning means may be relatively easily attained. The arrangement shown in FIG. 13 is substantially similar, but has the disadvantage of it being somewhat more difficult to attain an even deposit of glue or adhesive about the positioning means. The arrangement shown in FIG. 13 also requires a specially-made arcuate bottom cylindrical positioning means which, although it is, in some ways, more securely wedged into the positioning pad 67, does require specially made positioning means, whereas in the arrangement shown in FIG. 10, an ordinary hard chrome or other hard surface ball bearing may be purchased and used as the principal positioning means requiring no special manufacture.

The present invention, therefore, which comprises essentially the use of an arcuate positioning surfaces on the positioning pads of a stage plate in a photoresist printer, substantially completely eliminates any problem with buildup of photoresist material upon the positioning pads or other positioning means and substantially eliminates a very long-standing problem. It is not known at the present time exactly why the photoresist material does not buildup upon the arcuate surface, but it believed this is due to the difficulty of building up a deposit on a point contact surface, particularly where the maximum pressure is only on the point contact. Consequently, it is believed that since photoresist material tends to build up on a surface only where it has been applied against such surface with a fairly high pressure, when using an arcuate point contact arrangement, only the point contact attains the highest pressure necessary to provide a permanent adhesion and any such deposit which may depend on such adhesion, has insufficient area to hold to the contact over a prolonged period. In essence, a very small adhering section of photoresist is unstable when the essential clamping between the surface of the wafer and the surface of the arcuate positioning means is removed. Any such very small adhering area, which is inevitably attached on its sides to a larger area of photoresist adhering to itself, causes any photoresist material adhering to the point contact where sufficient pressure is applied to form an adherence, to be easily cracked off or detached from such underlying arcuate surface. The effect, in other words, is believed to be rather similar to trying to glue a piece of paper to a table top at only a very restricted single point. Any sort of disturbance or force upon such paper will easily shear such adhesion and cause the paper to become detached from the table top, even though the same size paper, if adhered over its entire surface, or even a substantial part of its surface, to the table top, would remain securely attached to such table top, even under the impetus of a fairly severe shearing force between the paper and the table top. As indicated, such theory of the operative mode of the invention is only theoretical at this time and the exact reason for the dramatic improvement and substantial elimination of any buildup of photoresist material on the positioning means of the invention is not definitively known at this time.

It should be understood that while the present invention has been described at some length, and in considerable detail and with some particularity with regard to several embodiments in connection with the accompanying figures and description, all such description and showing is to be considered illustrative only and the invention is not intended to be narrowly interpreted in connection therewith, or limited to any such particulars or embodiments, but should be interpreted broadly within the scope of the delineation of the invention set forth in the accompanying claims thereby to effectively encompass the intended scope of the invention.

I claim:

1. An alignment means for aligning semiconductor wafers in a photoprinting operation comprising:
   (a) an alignment plate adapted to position a semiconductor material wafer at a predetermined distance from an electromagnetic energy source,
   (b) said alignment plate having an open area for passage of electromagnetic energy and extension support means protruding into said open area for contact with a surface of said wafer to retain said wafer in the open area with one surface positioned at a predetermined distance from said electromagnetic energy source,
   (c) said extension support means being provided with point contact means in the form of at least one hemispherical point contact surface extending from said extension support means to the precise location at which the surface of said wafer is to be aligned, arranged and constructed for supportive point contact with the surface of said wafer in cooperation with other point contact means to align said surface of the wafer at a precise predetermined distance from said electromagnetic energy source,
   (d) said hemispherical point contact surface being a portion of the surface of a spherical body partially inset into a depression in the surface of the extension support means, and
   (e) a pin accommodated in an orifice in the extension support means extending between the lowermost portion of the depression and the back of the extension support means and contacting the lowermost portion of the spherical body in a bracing relationship and wherein said pin and spherical body and extrusion support means are securely joined.

2. An alignment means in accordance with claim 1 wherein the hemispherical point contact means has a hard, smooth chrome material surface.

3. An alignment means in accordance with claim 5 wherein the spherical body forming the point contact means comprises a ball bearing partially inset into said depression in the surface of the extension support means.

4. An alignment means in accordance with claim 3 wherein the point contact means is a retrofit installation and the surface of the original extension support means is cut back to accommodate the point contact means at the same relative position with respect to the light source as the original surface of the extension support means.

5. An alignment means in accordance with claim 1 wherein the secure joining of the pin, spherical body and extension support means is effected by an adhesive.

6. An apparatus for aligning semiconductor wafer with a partially masked ultraviolet light source comprising:
   (a) an ultraviolet light source mounted upon a support on a base,
   (b) a base plate mounted upon such support and arranged and constructed to support and align wafers at a predetermined distance from said light source,
   (c) said base plate having a plurality of alignment pads for supporting semiconductor wafer adjacent the edge, and
   (d) each alignment pad being provided on its contact surface with a single point contact means for contact with the wafer surface, said single point contact means having an arcuate contact surface for contacting the surface of semiconductor wafers,
   (e) the said point contact means being partially recessed in a depression in the surface of the alignment pad, and
   (f) wherein the exact alignment height of the recessed support means is determined by a pin contacting the lower portion of the single point contact means and extending to the bottom of the pad and the single point contact means, pin and alignment pad are securely joined.

7. An apparatus for aligning semiconductor wafers in accordance with claim 6 wherein the single point contact means has a hardened chrome or tungsten carbide material surface.

8. An apparatus for aligning semiconductor wafer in accordance with claim 7 wherein the single point contact means comprises a ball bearing recessed into the surface of the alignment pad.

9. An apparatus for aligning semiconductor wafers in accordance with claim 7 wherein the relative positions of the ultraviolet light source and the base plate is operatively adjustable.

10. An apparatus for aligning semiconductor wafers in accordance with claim 6 wherein the relative positions of the ultraviolet light source and the base plate are operatively fixed.

11. An apparatus for aligning semiconductor wafers in accordance with claim 6 wherein the secure joining of the single point contact means, pin and alignment pad is effected by an adhesive.

12. An apparatus for aligning semiconductor wafers with an ultraviolet light source adapted to cure photoresist material upon the surface of said wafer comprising:
   (a) a focus ring assembly mounted upon a wafer arm positioned a predetermined distance from said ultraviolet light source,
   (b) a stage plate, or xyθ base plane plate, adjustably attached to said focus plate,
   (c) said stage plate having wafer positioning pads for contacting and positioning a wafer by contact with the surface of said wafer,
   (d) the wafer positioning pads being providing with point contact means for contact with the surface of said wafers, (e) wherein there is a plurality of point contact means, each of which has an arcuate shape and is partially recessed into the surface of the wafer positioning pads, (f) wherein support pins extends through orifices in the wafer positioning pads from the back of the pads into contact with the underside of the point contact means and (g) wherein said pins, point contact means and positioning pads are securely joined.

13. An apparatus for aligning semiconductor wafers in accordance with claim 12 wherein the arcuate point contact means comprise hardened bodies at least hemispherical in configuration recessed into the surface of said wafer positioning pads.

14. An apparatus for aligning semiconductor wafers in accordance with claim 13 wherein the hardened hemispherical bodies comprise hardened spherical ball bearings.

15. An apparatus for aligning semiconductor wafers in accordance with claim 14 wherein each of the ball bearings and pins are adhesively secured in their respective orifices.

16. An apparatus for aligning semiconductor wafers in accordance with claim 15 wherein the surface of the wafer positioning pads are set back from the surface of the stage plate as a whole and the portion of the ball bearings above the surface extends to the level of the surface of the plate.

17. An apparatus for aligning semiconductor wafers in accordance with claim 12 wherein the source joining of the pins, point contact means and positioning pad is effected by an adhesive.

* * * * *